(12) United States Patent
Koo et al.

(10) Patent No.: US 10,952,346 B2
(45) Date of Patent: Mar. 16, 2021

(54) RACK HAVING SCALABILITY AND COMPATIBILITY

(71) Applicant: NAVER Business Platform Corp., Seongnam-si (KR)

(72) Inventors: Ji Hyun Koo, Seongnam-si (KR); Sang Min Roh, Seongnam-si (KR); Jaepil Kim, Seongnam-si (KR); Yonghee Jeong, Seongnam-si (KR)

(73) Assignee: NAVER Business Platform Corp., Seongnam-si (KR)

( * ) Notice: Subject to any disclaimer, the term of this patent is extended or adjusted under 35 U.S.C. 154(b) by 0 days.

(21) Appl. No.: 16/048,890

(22) Filed: Jul. 30, 2018

(65) Prior Publication Data

US 2019/0045653 A1 Feb. 7, 2019

(30) Foreign Application Priority Data

Aug. 1, 2017 (KR) .................. 20-2017-0004045 U

(51) Int. Cl.
| | |
|---|---|
| *H05K 7/14* | (2006.01) |
| *A47B 57/36* | (2006.01) |
| *H02B 1/34* | (2006.01) |

(52) U.S. Cl.
CPC .......... *H05K 7/1491* (2013.01); *A47B 57/36* (2013.01); *H02B 1/34* (2013.01); *H05K 7/1488* (2013.01); *H05K 7/1492* (2013.01)

(58) Field of Classification Search
CPC .. H05K 7/1491; H05K 7/1488; H05K 7/1492; H02B 1/34; A47B 57/36
See application file for complete search history.

(56) References Cited

U.S. PATENT DOCUMENTS

| | | | | |
|---|---|---|---|---|
| 3,050,194 A | * | 8/1962 | Sinninger | ............... H05K 7/183 108/106 |
| 6,201,702 B1 | * | 3/2001 | Schmitt | ..................... G06F 1/18 361/725 |

(Continued)

FOREIGN PATENT DOCUMENTS

| | | |
|---|---|---|
| KR | 20-0127851 | 12/1998 |
| KR | 200207329 Y1 | 12/2000 |
| KR | 10-2008-0031895 A | 4/2008 |

OTHER PUBLICATIONS

Korean Office Action dated May 27, 2020 for corresponding Korean Application No. 20-2020-0000954.

*Primary Examiner* — Ko H Chan
(74) *Attorney, Agent, or Firm* — Harness, Dickey & Pierce, P.L.C.

(57) ABSTRACT

A rack having scalability and compatibility may be configured to reversibly adjusted to be reversibly configured to support various computerized equipment having various sizes and power supply schemes without adjusting an outer volume boundary of the rack and without replacement of the rack. The rack may include a main frame and an additional frame. The main frame may structurally support computerized equipment having a particular dimension that is a first size within an enclosure that is a first enclosure at least partially defined by the main frame. The additional frame may reversibly couple with the main frame to adjust the enclosure to be a second enclosure at least partially defined by the at least one additional frame to reversibly configure the main frame to store computerized equipment having the particular dimension that is a second size that is different from the first size.

20 Claims, 13 Drawing Sheets

(56) References Cited

U.S. PATENT DOCUMENTS

| | | | | |
|---|---|---|---|---|
| 7,848,100 B2* | 12/2010 | Wayman | .............. | H04Q 1/035 |
| | | | | 248/200 |
| 7,965,503 B2* | 6/2011 | Yoder | .............. | G11B 33/12 |
| | | | | 165/121 |
| RE43,221 E * | 3/2012 | James | .............. | H02G 15/076 |
| | | | | 174/84 R |
| 9,131,769 B2* | 9/2015 | Obernesser | .......... | H05K 7/1488 |
| 9,232,669 B2* | 1/2016 | Love, II | .............. | H05K 7/1488 |
| 9,417,664 B1* | 8/2016 | Dailey | .............. | H05K 7/1454 |
| 9,635,779 B2* | 4/2017 | Mine | .............. | H05K 7/18 |
| 10,034,406 B2* | 7/2018 | Chapel | .............. | H05K 7/1489 |
| 10,588,235 B2* | 3/2020 | Jost | .............. | A47B 96/1441 |
| 10,687,439 B2* | 6/2020 | Hayashi | .............. | G06F 1/184 |
| 2004/0223311 A1* | 11/2004 | Lee | .............. | H05K 7/1425 |
| | | | | 361/826 |
| 2011/0013348 A1* | 1/2011 | Seibold | .............. | G06F 1/20 |
| | | | | 361/679.02 |
| 2014/0167578 A1* | 6/2014 | Lesser | .............. | H05K 7/1489 |
| | | | | 312/223.2 |
| 2015/0090679 A1* | 4/2015 | Obernesser | .......... | H05K 7/1488 |
| | | | | 211/26 |
| 2015/0382512 A1* | 12/2015 | Rogers | .............. | H05K 7/20554 |
| | | | | 361/679.49 |
| 2016/0324030 A1* | 11/2016 | Dailey | .............. | G02B 6/4471 |

* cited by examiner

RACK HAVING SCALABILITY AND COMPATIBILITY

CROSS-REFERENCE TO RELATED APPLICATION

This application claims the priority benefit, under 35 U.S.C. § 119, of Korean Patent Application No. 20-2017-0004045, filed on Aug. 1, 2017, in the Korean Intellectual Property Office, the disclosure of which is incorporated herein by reference.

BACKGROUND

1. Field of the Invention

The following description of example embodiments relates to racks having scalability and compatibility.

2. Description of the Related Art

A rack that is a basic platform in, for example, a server room such as a data center is a device configured to store and maintain computerized equipment (e.g., a server rack). For example, Korean Registered Utility Model Publication No. 20-0207329 discloses a server rack, where the server rack is easily transportable and installable due to a main frame constituting the rack being detachably assembled to a top plate and a lower plate.

Racks with various sizes, for example, a 16-inch standard rack and a 21-inch rack, are available based on a size of computerized equipment that such racks are configured to accommodate. In addition, such racks may be configured to use and/or support various power supply schemes, for example, alternating current (AC) 220V of main power or direct current (DC) power for additional power supply.

However, in the case of the racks according to the related art, for example, a first rack configured to support equipment having a first size (e.g., a 19-inch rack) may need to be one-to-one replaced with a separate rack that is configured to support equipment having a second, larger size (e.g., a 21-inch rack) in order to provide a second rack configured to support equipment having the second, larger size where the first rack is not configured to support equipment larger than the first size and the larger rack is not configured to support equipment smaller than the second size. Also, if a rack does not support a specific desired power supply scheme, the rack may need to be replaced in order to provide a rack configured to support the specific desired power supply scheme.

SUMMARY

At least one example embodiment provides a scalable or compatible rack that may be scalable, progressively and/or inversely, between accommodating (also referred to interchangeably herein as "storing," "supporting," "structurally supporting," or the like) computerized equipment of various sizes (e.g., equipment having at least one dimension, including length, width, depth, and/or height, that has various sizes); for example, the rack may be scalable between having a standard 19 inch size (e.g., defining an interior volume having a 19-inch width) to be configured to accommodate 19-inch equipment (e.g., equipment having a 19-inch width) and having a standard 21 inch size (e.g., defining an interior volume having a 21-inch width) to be configured to accommodate 21-inch equipment (e.g., equipment having a 21-inch width).

At least one example embodiment also provides a rack that is compatible between (e.g., configured to reversibly switch between supporting) an alternating current (AC) power supply scheme (e.g., based on being configured to accommodate (also referred to interchangeably herein as "store," "support," "structurally support," or the like) AC power supply equipment in a particular interior volume that is at least partially defined by one or more elements of the rack) and a direct current (DC) power supply scheme e.g., based on being configured to accommodate DC power supply equipment in a particular interior volume that is at least partially defined by one or more elements of the rack).

According to at least one example embodiment, a rack configured to support computerized equipment may include a main frame configured to structurally support computerized equipment having a particular dimension that is a first size within an enclosure that is a first enclosure at least partially defined by the main frame. The rack may include at least one additional frame configured to reversibly couple with the main frame to adjust the enclosure to be a second enclosure at least partially defined by the at least one additional frame to reversibly configure the main frame to store computerized equipment having the particular dimension that that is a second size that is different from the first size.

The first size may be greater than the second size.

The first size may be 21 inches and the second size may be 19 inches.

The at least one additional frame may include four additional frames configured to couple with separate, respective corner portions of four corner portions of the main frame that define four corner portions of the enclosure.

The at least one additional frame may be configured to fasten to the main frame based on coupling a hole included in the at least one additional frame and a corresponding hole of the main frame via a bolt and a nut.

The at least one additional frame may include at least one hook that is configured to be fixably extended through a hole of the main frame.

The main frame may include a coupler configured to fasten the at least one additional frame based on a shape of the at least one additional frame.

The rack may further include a rear frame configured to at least partially define a rear enclosure configured to support a direct current (DC) rectifier module, wherein at least a portion of the rear frame includes a mesh configured to support cable management.

The at least one additional frame may be an individual frame.

The main frame may include a plurality of coupling points, and the at least one additional frame may be configured to couple with at least one coupling point of the plurality of coupling points to be reversibly coupled with the main frame.

According to at least one example embodiment, a method may include providing a main frame, the main frame including one or more structural elements defining an enclosure that is a first enclosure within an outer volume boundary of the main frame, such that the main frame is configured to store computerized equipment having a particular dimension that is a first size within the first enclosure. The method may include reversibly coupling at least one additional frame with the main frame to adjust the enclosure to be a second enclosure at least partially defined by the at least one additional frame to reversibly configure the main frame to store computerized equipment having the particular dimension that that is a second size within the second enclosure, the second size different from the first size.

The first size may be greater than the second size.

The first size may be 21 inches and the second size may be 19 inches.

The reversibly coupling the at least one additional frame may couple four additional frames with separate, respective corner portions of four corner portions of the main frame that define four corner portions of the enclosure.

The reversibly coupling the at least one additional frame may fasten the at least one additional frame to the main frame based on coupling a hole included in the at least one additional frame and a corresponding hole of the main frame via a bolt and a nut.

The reversibly coupling the at least one additional frame may fixably extend at least one hook of the at least one additional frame through a hole of the main frame.

The main frame may include a coupler configured to fasten the at least one additional frame based on a shape of the at least one additional frame.

The method may further include providing a rear frame to at least partially define a rear enclosure configured to support a direct current (DC) rectifier module, wherein at least a portion of the rear frame includes a mesh configured to support cable management.

The at least one additional frame may be an individual frame.

The main frame may include a plurality of coupling points, and the reversibly coupling the at least one additional frame may couple the at least one additional frame with at least one coupling point of the plurality of coupling points to be reversibly coupled with the main frame.

BRIEF DESCRIPTION OF THE DRAWINGS

These and/or other aspects, features, and advantages of at least one example embodiment will become apparent and more readily appreciated from the following description of at least one example embodiment, taken in conjunction with the accompanying drawings of which.

DETAILED DESCRIPTION

Figure 1:
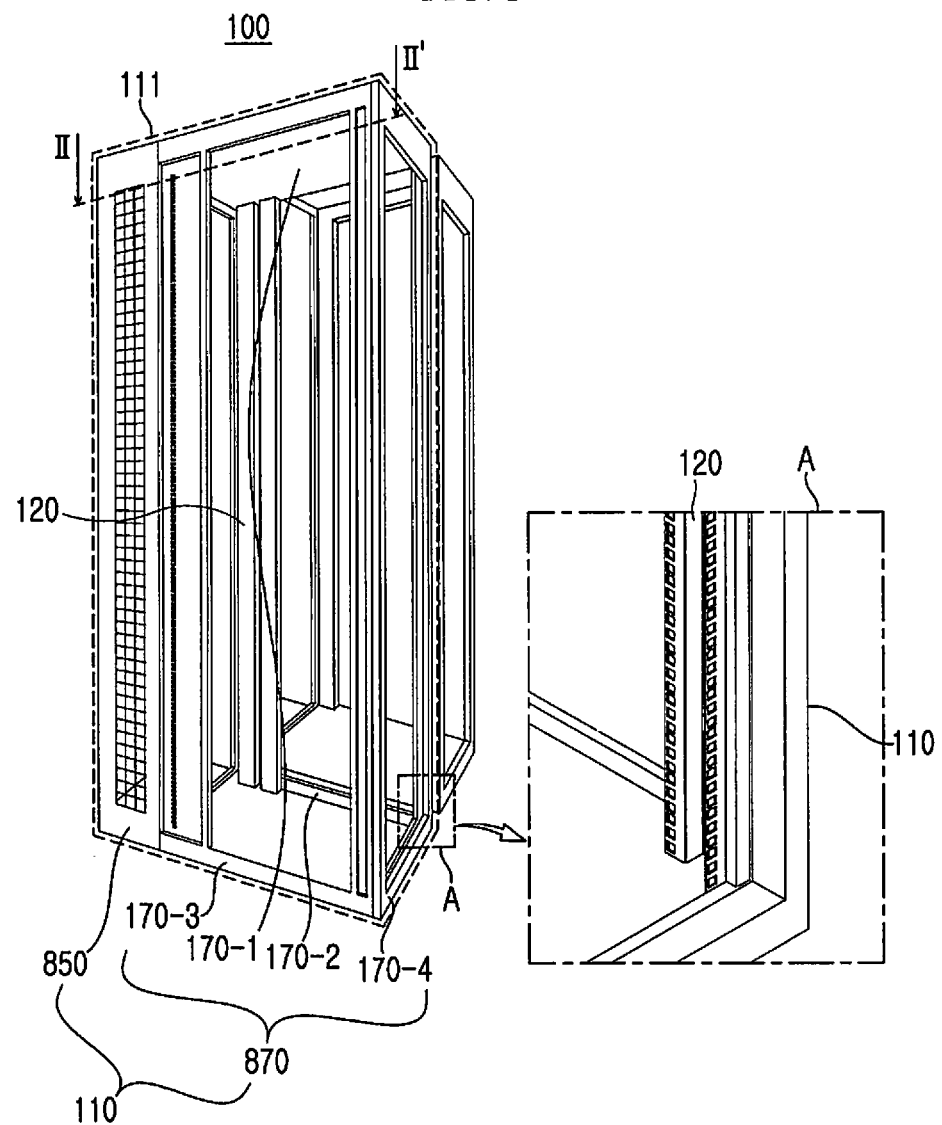
FIG. 1 is a perspective view of a rack according to at least one example embodiment.

One or more example embodiments will be described with reference to the accompanying drawings. Advantages and features of the one or more example embodiments, and methods for achieving the same may become explicit by referring to the accompanying drawings and the following one or more example embodiments. At least one example embodiment, however, may be embodied in various different forms, and should not be construed as being limited to only the illustrated one or more example embodiments. Rather, the illustrated one or more example embodiments are provided as examples so that this disclosure will be thorough and complete, and will fully convey the concepts of this disclosure to those skilled in the art. Accordingly, known processes, elements, and techniques, may not be described with respect to at least one example embodiment. Unless otherwise noted, like reference characters denote like elements throughout the attached drawings and written description, and thus descriptions will not be repeated.

When an element or a layer is referred to as being "on," "connected to," "coupled to," or "adjacent to," another element or layer, the element or the layer may be directly on, connected to, coupled to, or adjacent to, the other element or layer, or one or more other intervening elements or layers may be present (e.g., when an element or a layer is referred to as being "indirectly on," "indirectly connected to," "indirectly coupled to," or "indirectly adjacent to," another element or layer). In contrast, when an element or a layer is referred to as being "directly on," "directly connected to," "directly coupled to," or "immediately adjacent to," another element or layer, there are no intervening elements or layers present. An element that is "on" another element may be "above" or "underneath" the other element.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Figure 2:
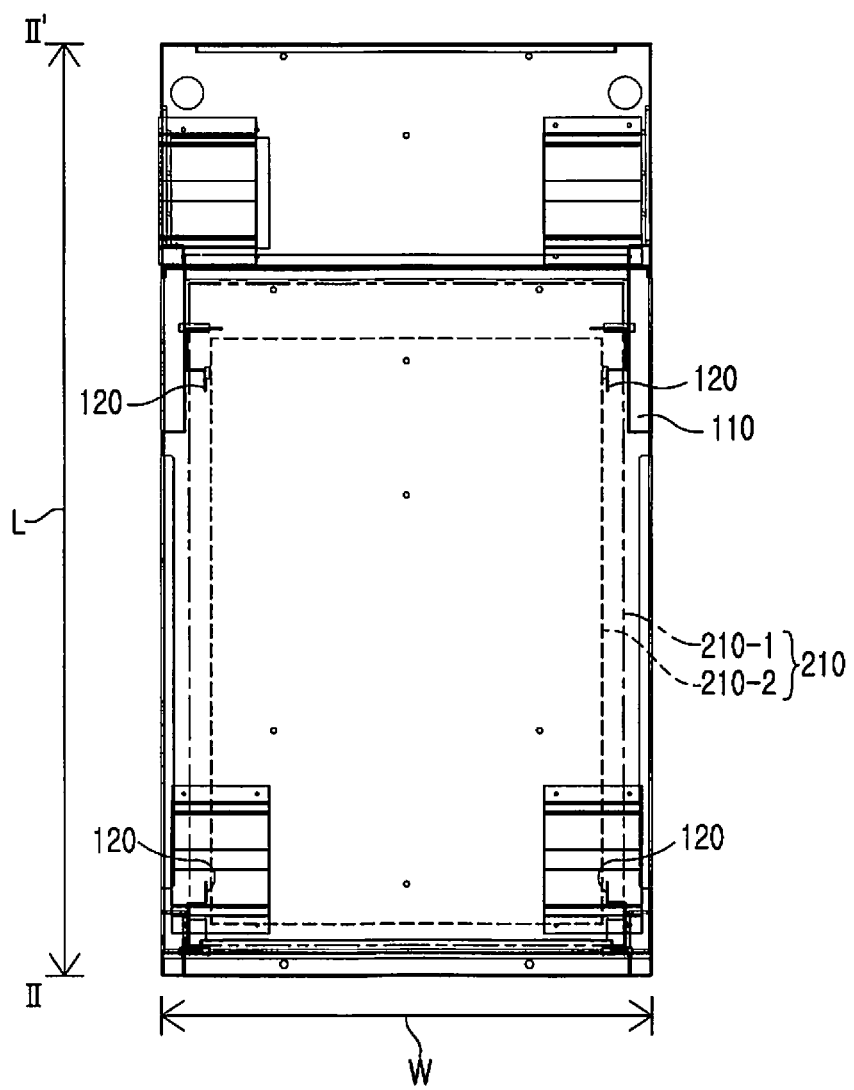
FIG. 2 is a top view of the rack of FIG. 1 along cross-sectional line II-II' according to at least one example embodiment.

FIG. 1 is a perspective view of a rack according to at least one example embodiment, and FIG. 2 is a top view of the rack of FIG. 1 along cross-sectional line II-II' according to at least one example embodiment.

FIGS. 1 and 2 illustrate examples in which a rack 100 for storing (configured to store, configured to accommodate, configured to structurally support, some combination thereof, or the like) computerized equipment having a particular dimension (e.g., a width, length, depth, height, some combination thereof, or the like) and/or standard size of a first size is compatible with, for example, transformable to the rack 100 for computerized equipment having a particular dimension (e.g., a width, length, depth, height, some combination thereof, or the like) and/or standard size of a second size using a main frame 110 of the rack 100 and four additional frames 120 provided in the main frame 110, for example as shown in region A of FIG. 1. Restated, the rack 100 as shown in FIGS. 1 and 2 may be configured to change between being configured to store (e.g., configured to accommodate, configured to structurally support, some combination thereof, or the like) computerized equipment having a particular dimension of a first size to being configured to store computerized equipment having the particular dimensions of a different, second size without changing the outer dimensions of the rack 100, based on the rack 100 having a "main frame 110" and further being configured to include one or more "additional frames 120" within a volume at least partially defined by the main frame 110. As shown in FIG. 1, the main frame 110 may include various structural elements, also referred to herein as "portions," including a portion 850 of structural elements, described further below, which at least partially define a rear enclosure 810 in the rack 100, a portion 870 of structural elements, including structural elements 170-1, 170-2, 170-3, and 170-4, which at least partially define enclosure 210 in the rack.

As used herein, equipment may have a "standard size" and/or a rack may be configured to support equipment having a standard size, such that the rack may be referred to as being of the standard size. As referred to herein, a "standard size" with regard to computerized equipment and/or a rack may refer to any Electronics Industries Alliance (EIA) standard, Consumer Electronics Association standard, International Electrotechnical Commission standard, some combination thereof, or the like. For example, a 19-inch rack as described herein may be a rack having a frame and/or interior space ("enclosure") that is configured to store computerized equipment having a standard 19-inch size under the EIA standard EIA-310-D for 19-inch standard sizes. In another example, a 21-inch rack as described herein may be a rack having a frame and/or interior space ("enclosure") that is configured to store computerized equipment having a standard 21-inch size under the European Telecommunications Standards Institute (ETS 300 119), or ETSI rack standard, for 21-inch standard sizes.

Here, the first size may be greater than the second size. For example, the first size (e.g., of a width dimension) may be 21 inches and the second size (e.g., of the same width dimension) may be 19 inches. Racks according to an international standard for 19-inch equipment may have the same width of 600 mm and may have a depth of, generally, 750 to 800 mm. In general, a rack for 21-inch equipment ("a rack configured to store 21-inch equipment") is configured to have a width of 700 mm. It will be easily understood that the first size and the second size or a difference between the first size and the second size may be variously set based on sizes of electronic equipment to be stored in the rack 100.

As shown in FIGS. 1-2, the main frame 110 may include one or more elements that collectively define a three-dimensional interior volume, or "enclosure 210," within the outer volume boundary 111 of the structure of the rack 100. As referred to herein, the outer volume boundary 111 of the structure of the rack 100 may be the outer volume boundary of the main frame 110 and thus may be defined by the structural elements of the main frame 110.

The rack 100 may include, in addition to the main frame 110, one or more additional frames that may be reversibly coupled with the main frame to adjust one or more dimensions, and thus the size of, the enclosure defined within the outer volume boundary 111 of the structure of the rack 100, so that the enclosure may be reversibly adjusted between various sizes that are configured to accommodate equipment having various sizes (e.g., one or more particular dimensions having various sizes) without adjusting the outer volume boundary 111 of the structure of the rack.

Accordingly, based on being configured to enable reversibly coupling of one or more additional frames 120 to one or more portions of the main frame 110, the rack 100 is configured to support computerized equipment of various sizes, and thus support reversibly changing between supporting computerized equipment of various sizes, without requiring replacement of the entire rack 100 for a separate rack (e.g., a rack having different outer volume boundaries 111) that is configured to support a different size of computerized equipment. Such a configuration of the rack 100 may be referred to herein as "scalability," in that the rack 100 is configured to "scale" between accommodating different sizes of computerized equipment without replacement of the rack 100 or modification ("adjustment") of the outer volume boundary 111 of the structure of the rack 100. Such scalability may reduce costs and/or expenditures associated with maintaining and/or operating a data center wherein the rack 100 is installed, as the rack 100 may be configured to "scale" between supporting different sizes of equipment without requiring replacement or modification of the outer volume boundary 111 of the rack 100, thereby mitigating replacement or re-arrangement of one or more racks 100 in the data center. In addition, because a single type of rack 100 may be included in the data center to support a range of sizes of computerized equipment, instead of utilizing multiple various different sizes of racks, capital costs associated with racks 100 may be reduced and rack configurations in a data center may be more efficient at least by virtue of avoiding configurations of differently-sized racks and instead promoting the use of configurations of uniformly-sized racks 100.

According to at least one example embodiment, including the at least one example embodiment shown in FIGS. 1 and 2, the rack 100 may be configured to enable four additional frames 120 to reversibly couple with separate, respective corner portions of four corner portions of a storage space of the computerized equipment ("interior volume," "enclosure 210," or the like) that is constituted ("at least partially defined") by one or more portions ("structural elements") of the main frame 110. Here, based on the additional frames 120 being configured to limit at least one particular dimension (e.g., width W, length L, or the like) of the enclosure 210 within the main frame 110, a coupling location ("coupling point") of each additional frame 120 in the main frame 110, a number ("quantity") of the additional frames 120, and a shape of each additional frame 120 may not be limited. For example, as shown in at least FIG. 2, two additional frames 120 may couple with the main frame 110 on the left side and the right side of the main frame 110, respectively, to thereby limit the width W of the rack 100.

According to at least one example embodiment, the rack 100 for the first size may be compatible with, for example, transformable, "scalable," or the like, to be configured to reversibly adjust one or more dimensions of (e.g., the "size" of) the enclosure 210 between a first, larger-sized enclosure 210-1 and a second, smaller-sized enclosure 210-2 based on being configured to enable one or more additional frames 120 to be coupled in the main frame 110 of the rack 100 (where the main frame 110 defines enclosure 210-1) to at least partially define enclosure 210-2 based on limiting an inner width W of the enclosure 210 of the rack 100. In another example, the rack 100 for the second size may be scalable, for example, expandable between a second size and a larger first size based on removing the additional frames 120 from the rack 100 to expand the enclosure 210 from the second, smaller enclosure 210-2 at least partially defined by the additional frames 120 to the first, larger enclosure 210-1 at least partially defined by the main frame 110. Restated, the one or more additional frames 120 may be reversibly ("detachably," "removably," or the like) coupled with the main frame 110 to reversibly scale (transform, expand, or the like) the rack 100 between being configured to store equipment having various sizes without altering the outer volume boundary 111 of the rack 100. Accordingly, the rack 100 may be configured to enable various sizes of equipment to be stored therein over time without requiring a replacement of the rack or adjustment of the outer volume boundary of same, thereby enabling reduced capital and maintenance expenditures associated with rack placement, installation, ordering, management, maintenance, some combination thereof, or the like. As referred to herein, reversibly configuring the rack 100 to store computerized equipment having one or more various particular dimensions having one or more particular sizes, e.g., based on reversibly coupling one or more additional frames 120 to one or more coupling points of main frame 110, may be referred to as reversibly configuring the main frame 110 to store computerized equipment having one or more various particular dimensions having one or more particular sizes.

One of ordinary skill in the art may easily understand that various schemes may be used to attach or detach the main frame 110 and the additional frames 120. For example, the main frame 110 may include a coupler configured to fasten one or more frames of the additional frames 120 relative to the main frame 110. As another example, the main frame 110 may include a hook, such as at least one hook, that enables the additional frames 120 to be fastened through (e.g., extended through) one or more holes included in the main frame 110. As another example, the main frame 110 and the additional frames 120 may be configured to couple with each other through corresponding holes included in the main frame 110 and the additional frames 120 using bolts and nuts.

Figure 3:
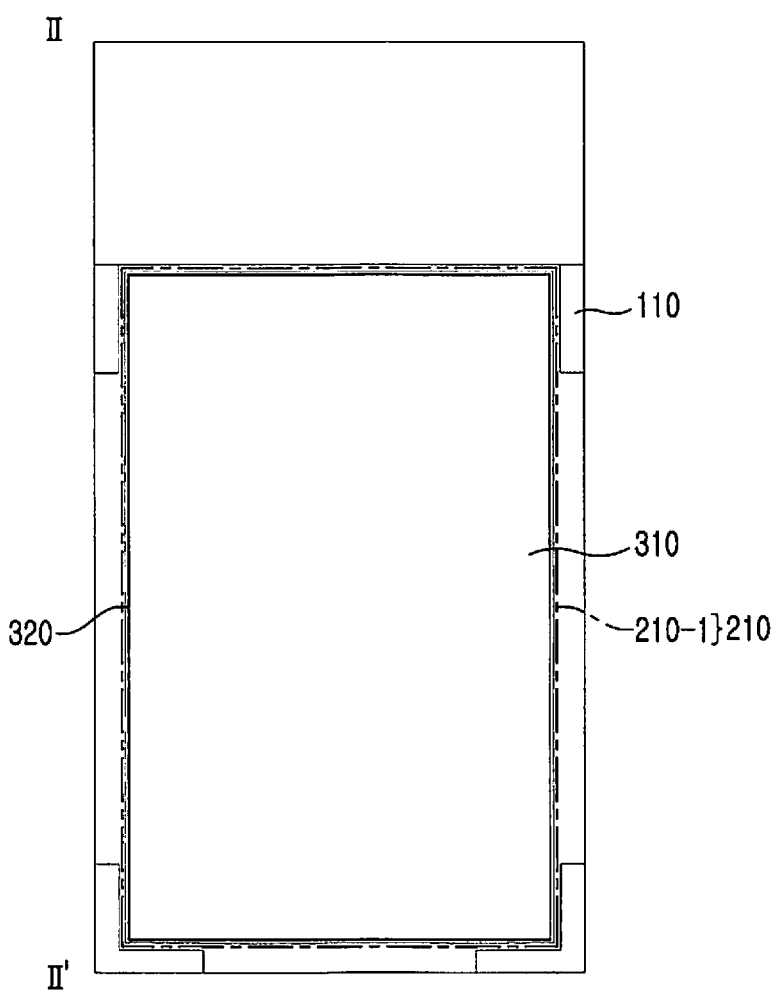
FIG. 3 illustrates an example in which a shelf for equipment with a first size couples with a main frame of the rack of FIG. 1 along cross-sectional line II-IF according to at least one example embodiment.
Figure 4:
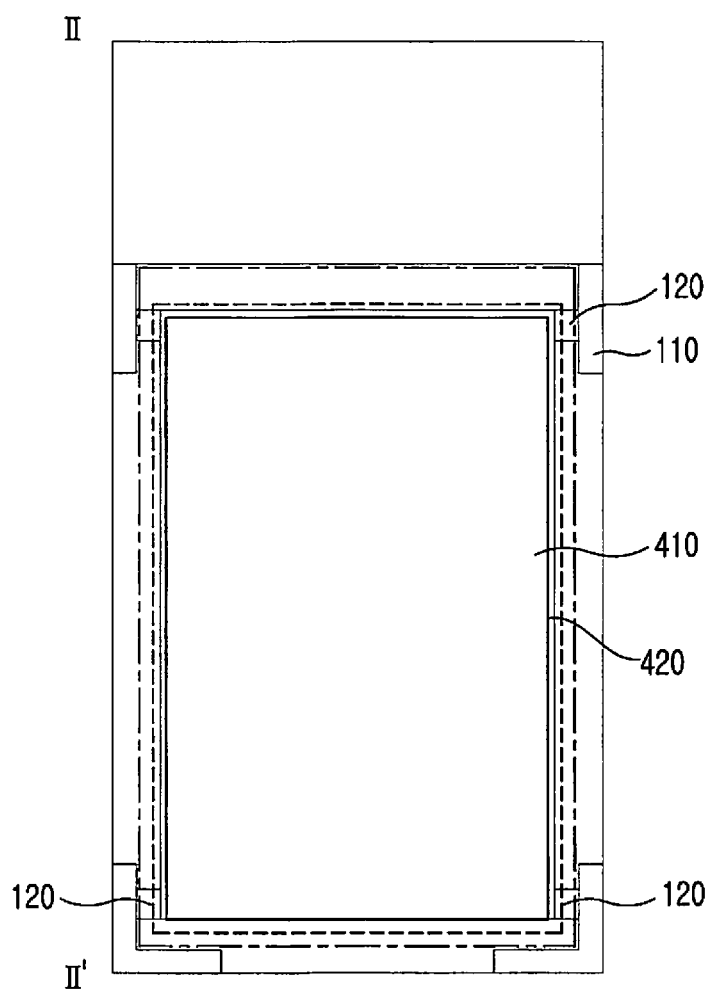
FIG. 4 illustrates an example in which a shelf for equipment with a second size couples with a main frame of FIG. 1 along cross-sectional line II-IF using additional frames according to at least one example embodiment.

FIG. 3 illustrates an example in which a shelf for equipment with a first size couples with a main frame according to at least one example embodiment, and FIG. 4 illustrates an example in which a shelf for equipment with a second size couples with a main frame using additional frames according to at least one example embodiment.

Referring to FIG. 3, a first shelf 310 for equipment with a first size, also referred to herein as a first shelf 310 configured to structurally support ("support," "accommodate," "store," or the like) computerized equipment 320 having a particular dimension of ("that is") a first size, may directly couple with the main frame 110 within the enclosure 210-1 at least partially defined by the main frame 110 within the interior of the rack (e.g., within the interior of the outer volume boundary 111 of the rack 100). Referring to FIG. 4, four additional frames 120 are coupled with the main frame 110 to at least partially define a smaller enclosure 210-2, and a second shelf 410 for equipment with a second size, also referred to herein as a second shelf 410 configured to structurally support ("support," "accommodate," "store," or the like) computerized equipment 420 having a particular dimension of ("that is") a second size, may couple with the additional frames 120. As shown, the first shelf 310 may be configured to be accommodated within enclosure 210-1 particularly, and the second shelf 410 may be configured to be accommodated within enclosure 210-2 particularly. Accordingly, the main frame 110 may be understood to be configured to support the first shelf 310 within enclosure 210-1, and the one or more additional frames 120 may be understood to be configured to support the second shelf 410 within enclosure 210-2.

Figure 5:
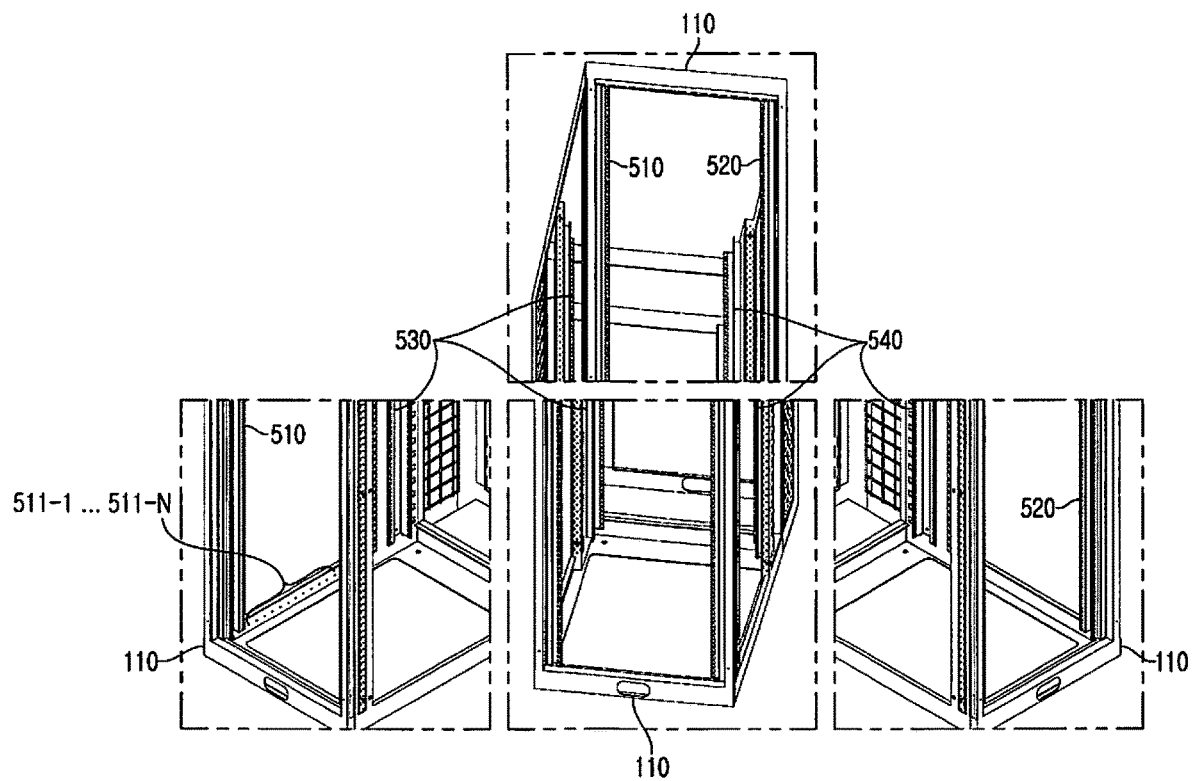
FIG. 5 is a set of front views, at various angles, of a rack manufactured according to at least one example embodiment.

FIG. 5 is a set of front views, at various angles, of a rack manufactured according to at least one example embodiment. Referring to FIG. 5, a rack for 21 inches (e.g., a rack configured to support 21-inch equipment in accordance with ETSI standards regarding 21-inch racks) may be compatible with, for example, transformable to (e.g., configured to scale to) a rack for 19 inches (e.g., a rack configured to support 19-inch equipment in accordance with EIA standards regarding 19-inch racks) based on being configured to enable four additional frames 510, 520, 530, and 540 to be coupled to the aforementioned main frame 110 of the rack 100, within an interior of an enclosure (e.g., enclosure 210-1) defined by the main frame 110 in order to define an enclosure (e.g., enclosure 210-2). Here, the four additional frames 510, 520, 530, and 540 may correspond to the aforementioned four additional frames 120.

Figure 6:
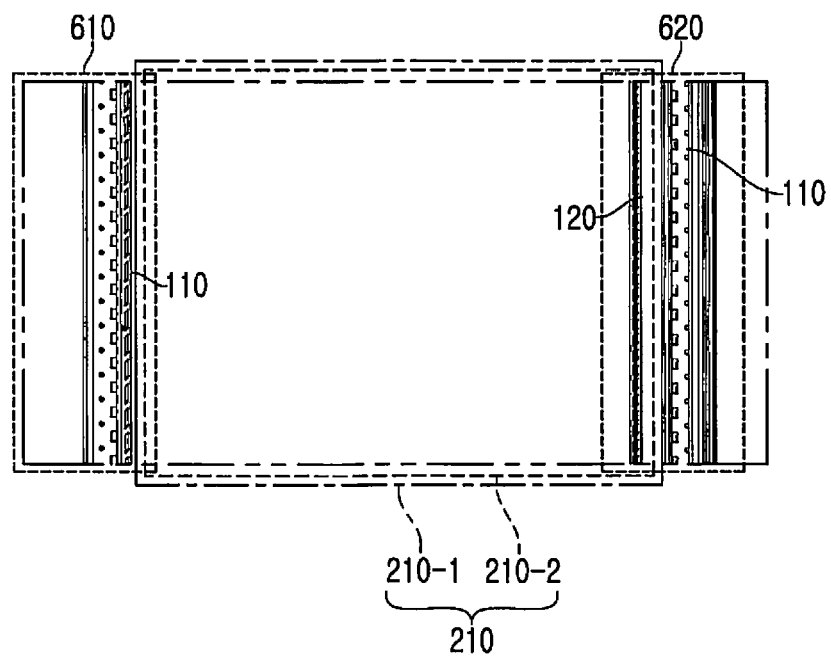
FIG. 6 is a portion of a rack for comparison between the rack in which an additional frame is not installed and the rack in which the additional frame is installed according to at least one example embodiment.

FIG. 6 is a portion of a rack for comparison between the rack in which an additional frame is not installed and the rack in which the additional frame is installed according to at least one example embodiment. Referring to a portion 600 of a rack of FIG. 6, a first box 610 indicated with dotted lines shows a portion of the main frame 110 that does not couple with the additional frame 120 and a second box 620 indicated with dotted lines shows a portion of the main frame 110 that couples with the additional frame 120.

Referring to FIG. 6, in some example embodiments, separate portions of the main frame 110 collectively define an enclosure 210-1 that is configured to accommodate equipment having at least one dimension of a first size, and at least one additional frame 120 may at least partially define (e.g., may, with at least one portion of the main frame 110 in portion 610, collectively define) an enclosure 210-2 that is configured to accommodate equipment having the at least one dimension of a separate, second (e.g., smaller) size.

As described above, FIGS. 5 and 6 illustrate examples of compatibility and scalability of a rack between supporting equipment having a dimension of 19 inches and equipment having a dimension of 21 inches depending on whether one or more additional frames 120 are coupled with the main frame 110.

Referring to FIGS. 5-6, in at least one example embodiment, only an individual additional frame (e.g., 510) may be reversibly coupled to the main frame 110 in order to adjust the size of the enclosure 210 (e.g., between 210-1 and 210-2) to reversibly adjust the rack 100 between being configured to support equipment of a first size and equipment of a second size.

Still referring to FIGS. 5-6, in at least one example embodiment, a main frame 110 may include multiple coupling points 511-1 to 511-N (where N is a positive integer value), and the rack 100 is configured to enable an additional frame (e.g., additional frame 510) to be coupled to the main frame 110 via coupling with any one of the coupling points 511-1 to 511-N, a limited plurality (e.g., 511-1 to 511-(N−1)) of the coupling points 511-1 to 511-N, or the like, where each coupling point 511-1 to 511-N is associated with a particular enclosure 210 size, to configure the rack 100 to define an enclosure 210 having a particular size and thus configured to accommodate computerized equipment having a particular size and/or one or more particular dimensions having a particular size ("magnitude").

As referred to herein, equipment and/or racks "of" a given size, "having" a given size, or the like will be understood to be associated with and/or having at least one particular dimension that is the given size (e.g., a width of 19 inches).

Figure 7:
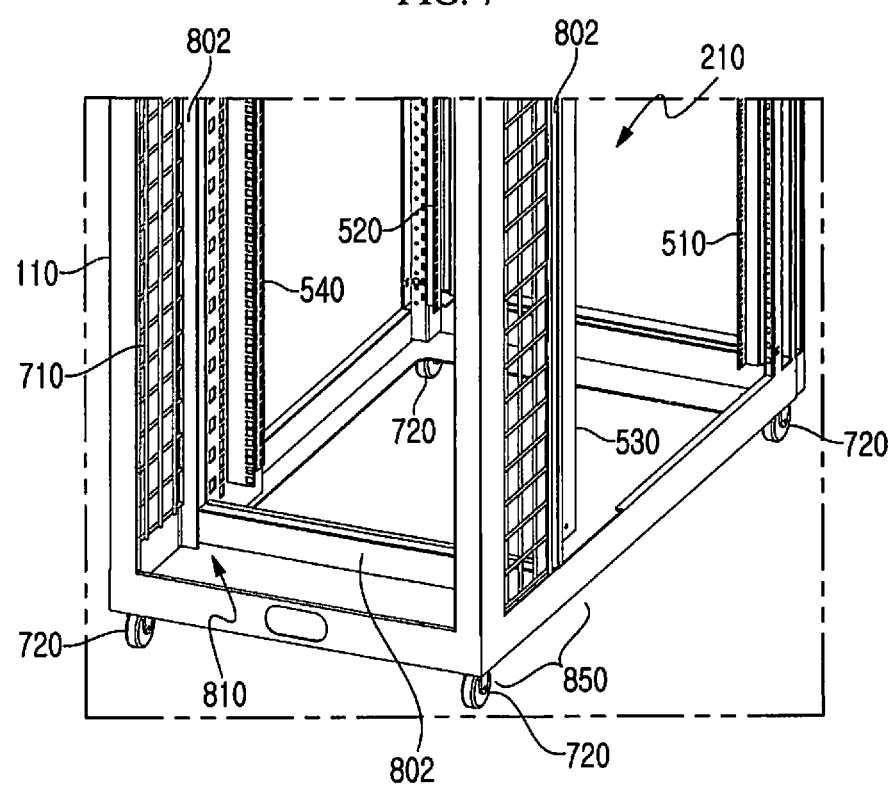
FIG. 7 is a rear view of a rack according to at least one example embodiment.
Figure 8:
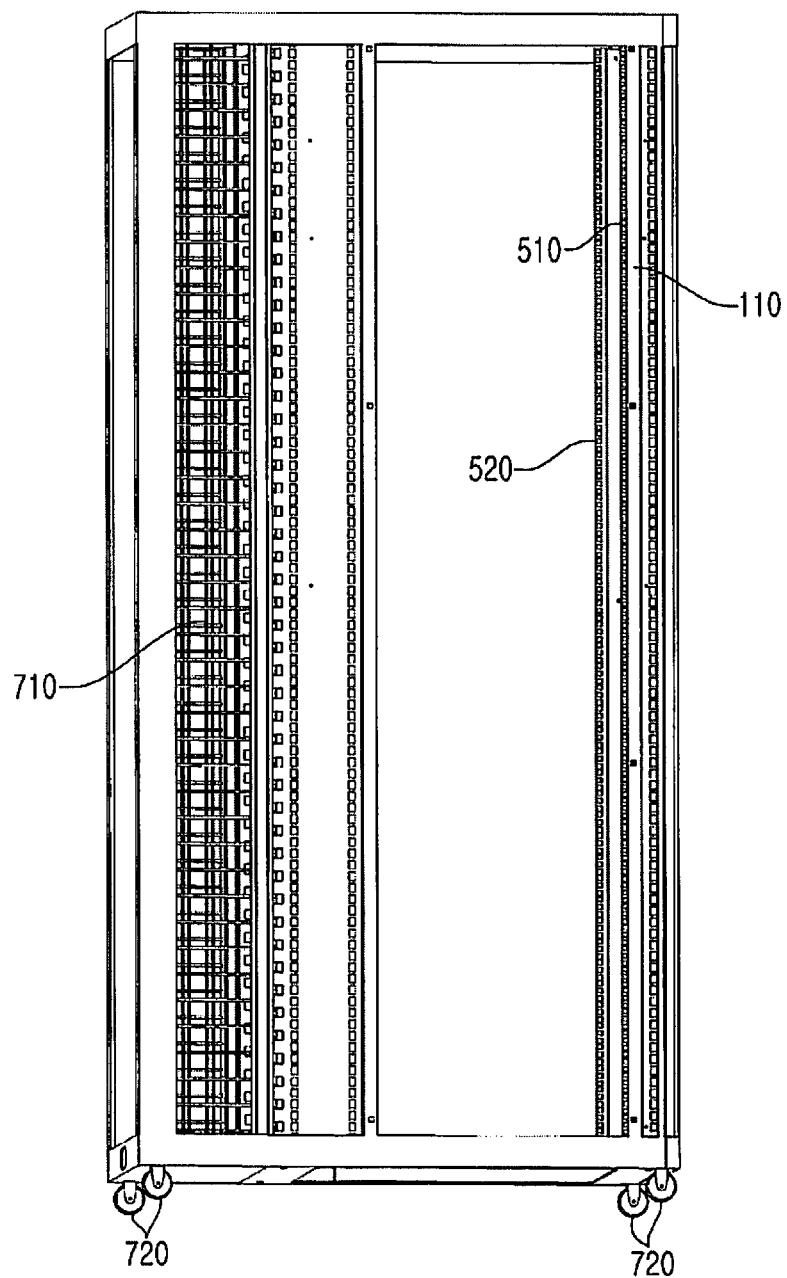
FIG. 8 is a right-side view of a rack according to at least one example embodiment.
Figure 9:
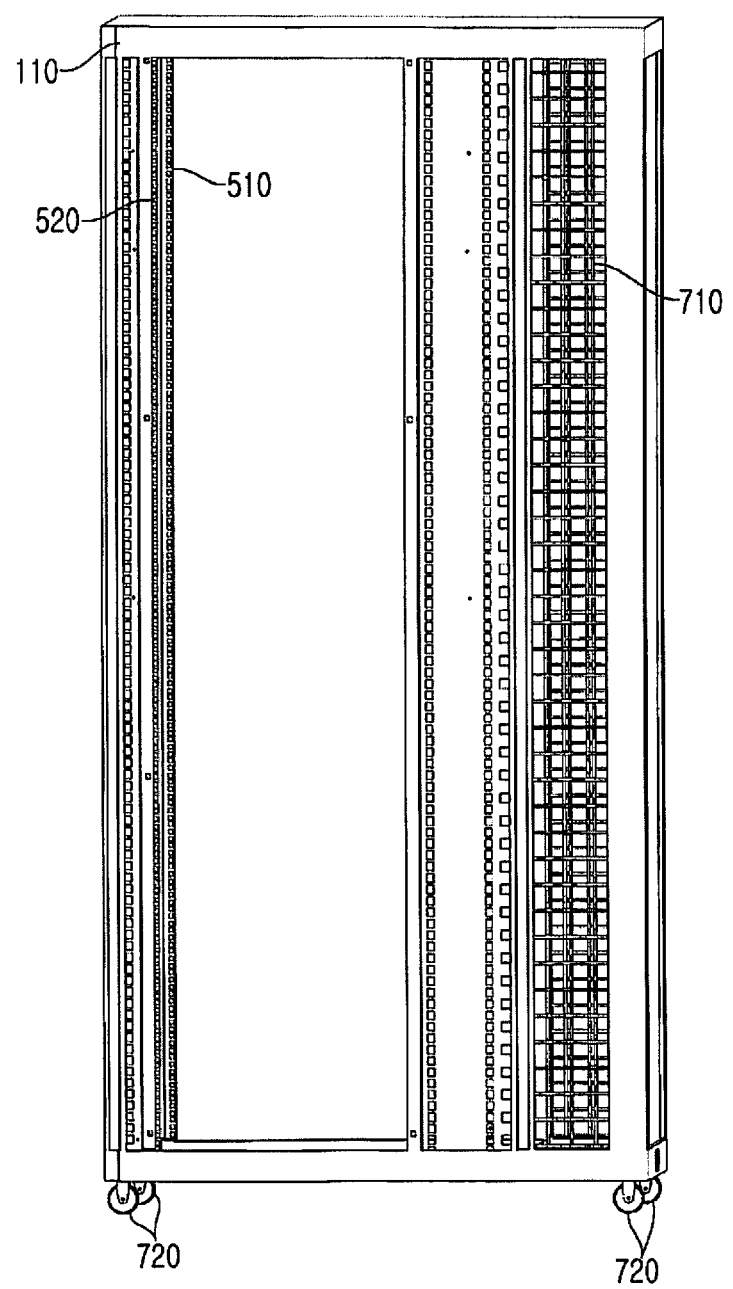
FIG. 9 is a left-side view of a rack according to at least one example embodiment.

FIG. 7 is a rear view of a rack according to at least one example embodiment, FIG. 8 is a right-side view of a rack according to at least one example embodiment, and FIG. 9 is a left-side view of a rack according to at least one example embodiment.

FIG. 7 shows a portion of a rear view of the aforementioned rack 100, FIG. 8 shows a right-side view of the rack 100, and FIG. 9 shows a left-side view of the rack 100. Referring to FIG. 7, FIG. 8, and FIG. 9, one or more structural elements of the main frame 110 of the rack 100 at least partially forms ("defines") a rear space ("rear enclosure 810") that is separate from a space ("enclosure 210") for storing the computerized equipment and that is also at least partially defined by the main frame 110. For example, the space for storing the computerized equipment ("enclosure 210") may refer to a space with a reduced size from 21 inches to 19 inches through the four additional frames 510, 520, 530, and 540 (e.g., enclosure 210-2), and a separate rear space ("rear enclosure 810") may be formed ("defined") at the rear of the space for storing the computerized equipment ("enclosure 210"). Restated, and as shown in at least FIG. 7, the main frame 110 may include one or more interposing structural elements 802 that at least partially define a demarcation ("boundary") between enclosure 210 and enclosure 810 within the outer volume boundary 111 of rack 100.

The rear space ("enclosure 810") of the rack 100 may be configured to be used as a space for installing (e.g., configured to "accommodate," "store," "support," structurally support, or the like) a direct current (DC) rectifier module ("assembly") that is configured to supply DC power to computerized equipment supported within enclosure 210 or as a space for applying (e.g., configured to "accommodate," "store," "support," structurally support, or the like) a bus duct of over current protection (OCP) DC power. Since the DC rectifier module ("DC rectifier assembly") is provided ("included," "accommodated," "stored," "supported," "structurally supported," or the like) in the rear space (enclosure 810) of the rack 100, it is possible to supply alternating current (AC) 220V as main power to at least some computerized equipment accommodated in enclosure 210 and to, at the same time, supply DC power through the DC rectifier module to at least some computerized equipment accommodated in enclosure 210. That is, various power supply schemes may be available. Restated, the rack 100 may be configured to support various power supply schemes for computerized equipment accommodated in enclosure 210, including supporting different power supply schemes simultaneously, based at least in part upon being configured to support at least one DC rectifier module in enclosure 810 and/or a bus duct of over current protection (OCP) DC power at least partially in enclosure 810. Accordingly, based on being configured to simultaneously support computerized equipment with various, different power supply schemes, the rack 100 may enable reduced capital costs and maintenance costs based on enabling a single rack and/or type of rack to be used to support multiple various power supply schemes and to further enable computerized equipment utilizing different power supply schemes to be supported by a single, common rack 100. Also, a mesh-type net 710, also referred to herein as simply a "mesh," configured to support cable management may be included in rack 100 to at least a portion of a rear frame portion 850 of main frame 110 that constitutes ("at least partially defines") the rear space of the rack 100. The rear frame portion 850 of the main frame 110 may be referred to herein as a "rear frame" of rack 100 and may include a portion of the structural elements of main frame 110, including interposing structural elements 802, which collectively define the rear enclosure 810, separately from the portions and/or structural elements of the main frame which collectively define at least enclosure 210-1 of enclosure 210.

Also, referring to FIG. 7, FIG. 8, and FIG. 9, a plurality of wheels 720 are provided ("included") in rack 100 to enable the rack 100 to be moved conveniently.

Figure 10:
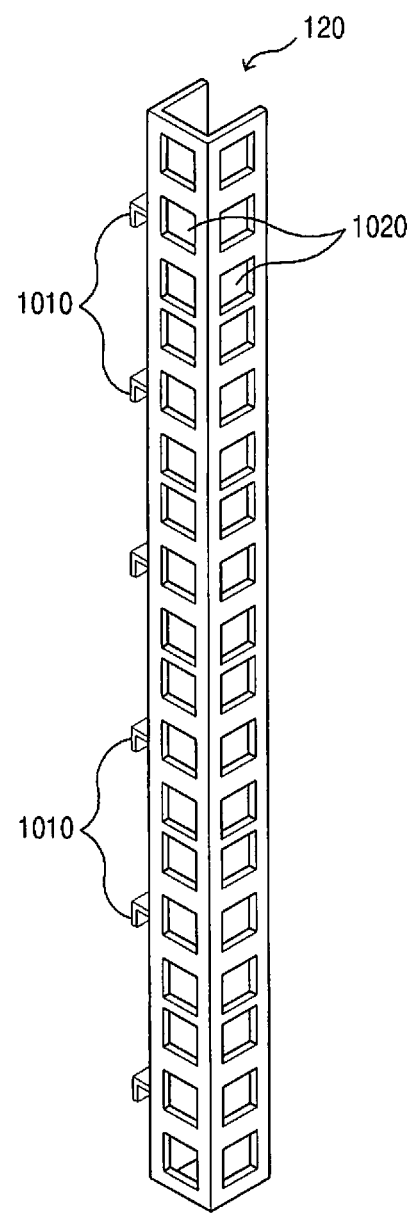
FIG. 10 is a perspective view illustrating an example of an additional frame according to at least one example embodiment.

FIG. 10 is a perspective view of an additional frame according to at least one example embodiment. As described above, based on the additional frames 120 being configured to limit at least one dimension (e.g., the width) of the enclosure 210 defined within the main frame 110, a coupling location ("coupling point") of each additional frame 120 within the main frame 110, a number of the additional frames 120, and a shape thereof may not be limited. Referring to FIG. 10, an additional frame 120 is in a rectangular parallelepiped shape with an empty interior at least partially bounded by structural material, in a structure of which one side is open, and includes a hook 1010 configured to couple with a coupling point (e.g., 511-1 to 511-N) of the main frame 110 (e.g., based on being fixably extended through a coupling point that is a hole included in a structural element of the main frame 110). In some example embodiments, the main frame 110 includes a coupler configured to fasten one or more additional frames 120 based on a shape of the one or more additional frames 120. A shape, a length, an arrangement location, etc., of the hook 1010 may be determined based on an interval, a length, a width, a size, an arrangement location, or the like, of a coupling point (e.g., a hole) of (e.g., included in the structure of) the main frame 110. In at least one example embodiment, the additional frame 120 may include a plurality of holes 1020 through which the additional frame 120 is configured to couple with computerized equipment or a shelf, for example, the second shelf 410 of FIG. 4, which is configured to support (e.g., "structurally support") computerized equipment.

In at least one example embodiment, the additional frame 120 may couple with the main frame 110 using a bolt and a nut instead of using the hook 1010. In at least one example embodiment, the main frame 110 may include a coupler configured to fasten the additional frame 120 based on a shape of the additional frame 120. Here, the additional frame 120 may couple with the main frame 110 by inserting into the coupler. For example, the main frame 110 may include a coupling that is a hook element and/or hole that has a particular shape and/or position on one or more structural elements of the main frame 110, such that the coupler is specifically configured to couple with an additional frame based on the additional frame having a first particular shape and is further configured to be restricted from coupling with one or more additional frames based on the one or more additional frames having one or more second particular shapes that are different from the first particular shape.

Figure 11:
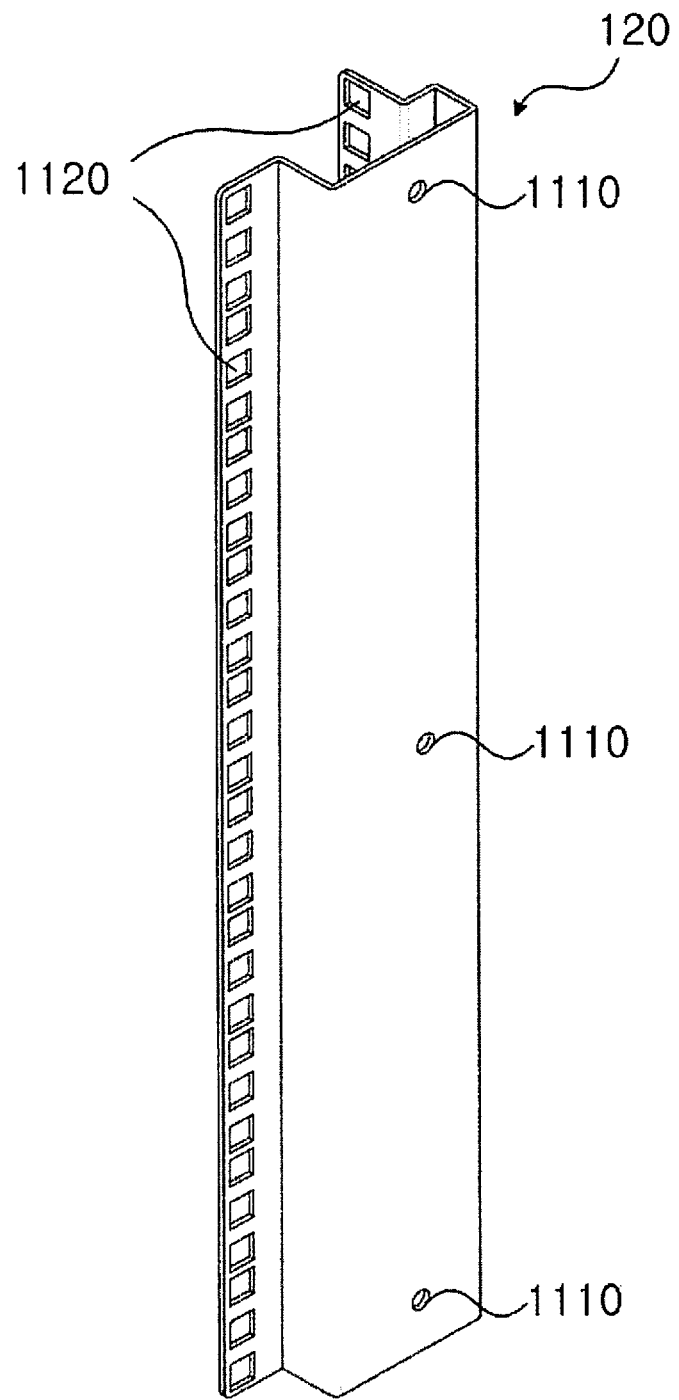
FIGS. 11 and 12 are perspective views illustrating other examples of an additional frame according to at least one example embodiment.
Figure 12:
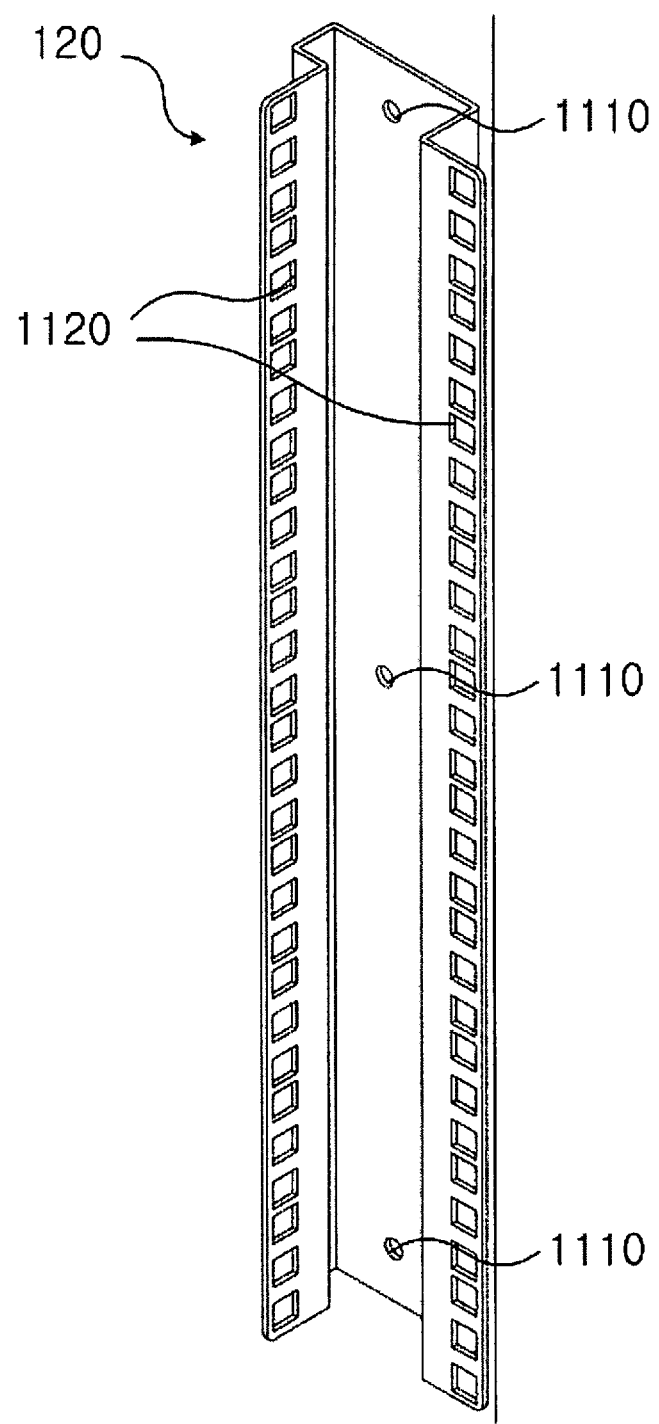

FIGS. 11 and 12 are perspective views illustrating other examples of an additional frame according to at least one example embodiment. Referring to FIGS. 11 and 12, the additional frame 120 of FIG. 2 is illustrated at different angles. The additional frame 120 according to at least one example embodiment may include a plurality of holes 1110 configured to enable connection ("coupling") of the additional frame 120 to the main frame 110. For example, the additional frame 120 may couple with the main frame 110 through the holes 1110 using a bolt coupling scheme. In at least one example embodiment, the additional frame 120 may further include a plurality of holes 1120 through which the additional frame 120 is capable of coupling ("configured to couple") with the computerized equipment or a shelf, for example, the second shelf 410 of FIG. 4, for storing the computerized equipment.

Referring to FIGS. 10 through 12, the plurality of holes 1020 (see FIG. 10) and the plurality of holes 1120 (see FIGS. 11 and 12) may be provided ("included") such that the additional frame 120 is configured to enable adjusting a height of the shelf or the computerized equipment to be coupled thereto within the enclosure 210 of the rack, thereby enabling the rack 100 to be configured to enable adjustment of relative heights of various computerized equipment supported within enclosure 210, including vertical spacings between separate shelves and thus computerized equipment within the enclosure 210. As a result, based on being configured to enable one or more additional frames 120 to be coupled to the main frame 110, where the one or more additional frames 120 are configured to enable adjustable positioning of a height of one or more shelves and thus computerized equipment within enclosure 210, the rack 100 is configured to enable adjustable positioning of computerized equipment within rack 100 without replacement of the rack 100 or outer volume boundary 111 thereof, thereby enabling reduction of capital expenditures and maintenance costs associated with a facility in which one or more racks are included to support computerized equipment, including a data center.

Accordingly, it is possible to provide a scalable function or a compatible function, for example, from 19 inches to 21 inches or from 21 inches to 19 inches, using a single rack, and to enable the rack to be compatible between an AC power supply scheme and a DC power supply scheme.

Figure 13:
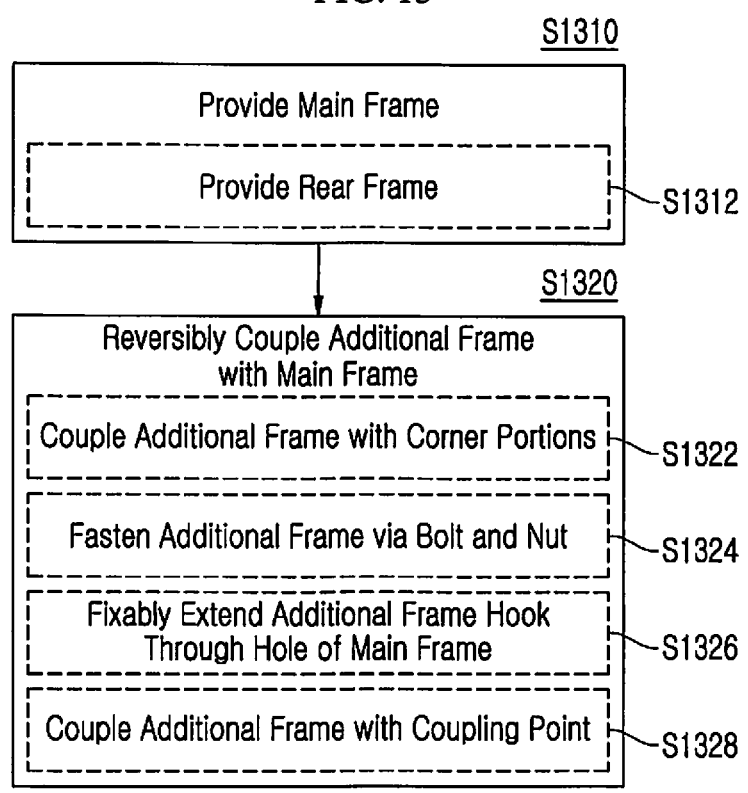
FIG. 13 illustrates a process of one or more methods which may be implemented with regard to the rack as described herein, according to at least one example embodiment.

FIG. 13 illustrates a process of one or more methods which may be implemented with regard to the rack 100 as described herein, according to at least one example embodiment.

As shown in FIG. 13, a method may include, at S1310, providing a main frame 110, the main frame 110 including one or more structural elements (e.g., 170-1 to 170-4) defining an enclosure 210 that is a first enclosure 210-1 within an outer volume boundary 111 of the main frame 110, such that the main frame 110 is configured to store computerized equipment (e.g., 320) having a particular dimension that is a first size within the first enclosure 210-1. The method may include, at S1320, reversibly coupling at least one additional frame 120 with the main frame 110 to adjust the enclosure 210 to be a second enclosure 210-2 at least partially defined by the at least one additional frame 120 to reversibly configure the main frame 110 to store computerized equipment (e.g., 420) having the particular dimension that that is a second size within the second enclosure 210-2, the second size different from the first size. At S1322, the reversibly coupling at S1320 may include coupling four additional frames with separate, respective corner portions of four corner portions of the main frame 110 that define four corner portions of the enclosure 210. At S1324, the reversibly coupling at S1320 may include fastening the at least one additional frame 120 to the main frame 110 based on coupling a hole included in the at least one additional frame 120 and a corresponding hole of the main frame 110 via a bolt and a nut. At S1326, the reversibly coupling at S1320 may fixably extend at least one hook of the at least one additional frame 120 through a hole of the main frame 110. The main frame may include a plurality of coupling points. At S1328, the reversibly coupling at S1320 may include coupling the at least one additional frame with at least one coupling point of the plurality of coupling points to be reversibly coupled with the main frame.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A rack configured to support computerized equipment, the rack comprising:
    a main frame including a plurality of fixed structural elements defining a first enclosure within the main frame, the first enclosure having a particular first set of dimensions, the particular first set of dimensions including a first width and a first length, the main frame configured to directly couple with a first shelf within the first enclosure to structurally support computerized equipment having a particular dimension that is a first size within the first enclosure; and
    at least one additional frame configured to detachably couple with the main frame inside the first enclosure defined by the plurality of fixed structural elements to at least partially define a second enclosure within the first enclosure, the second enclosure having a particular second set of dimensions that is different from the particular first set of dimensions, the particular second set of dimensions including a second width and a second length, the second width different from the first width, the second length different from the first length, such that the plurality of fixed structural elements continue to define the first enclosure having the particular first set of dimensions simultaneously with the at least one additional frame defining the second enclosure having the particular second set of dimensions within the first enclosure, the at least one additional frame configured to couple with a second shelf within the second enclosure to structurally support computerized equipment having the particular dimension that that is a second size within the second enclosure, the second size is different from the first size,
    wherein the at least one additional frame has a rectangular parallelepiped shape defining an empty interior at least partially bounded by structural material, in a structure of which one side is open,
    wherein the at least one additional frame is configured to couple with the second shelf within the second enclosure such that the main frame that defines the first enclosure is indirectly coupled with the second shelf within the second enclosure via the at least one additional frame,
    wherein the rack further includes a rear frame configured to at least partially define a rear enclosure configured to support a direct current (DC) rectifier module.

2. The rack of claim 1, wherein the first size is greater than the second size.

3. The rack of claim 1, wherein the first size is 21 inches and the second size is 19 inches.

4. The rack of claim 1, wherein the at least one additional frame includes four additional frames configured to couple with separate, respective corner portions of the main frame, the separate, respective corner portions of the main frame defining separate, respective corner portions of the first enclosure.

5. The rack of claim 1, wherein the at least one additional frame is configured to fasten to the main frame using a bolt and a nut.

6. The rack of claim 1, wherein
the main frame includes a structural element that includes a hole, and
the at least one additional frame includes at least one hook that is configured to be fixably extended through the hole of the main frame to couple the at least one additional frame with the main frame.

7. The rack of claim 1, wherein the main frame includes a coupler that is configured to couple with the at least one additional frame based on the additional frame having a first particular shape.

8. The rack of claim 1, wherein
at least a portion of the rear frame includes a mesh configured to support cable management.

9. The rack of claim 1, wherein the at least one additional frame is an individual frame.

10. The rack of claim 1, wherein
the main frame includes a plurality of coupling points, and
the at least one additional frame is configured to couple with at least one coupling point of the plurality of coupling points to be detachably coupled with the main frame.

11. A method to configure a rack having a fixed outer volume boundary to support computerized equipment having different sizes, the method comprising:
providing a main frame, the main frame including a plurality of fixed structural elements defining a first enclosure within an outer volume boundary of the main frame that is the outer volume boundary of the rack, the first enclosure having a particular first set of dimensions, the particular first set of dimensions including a first width and a first length, the main frame configured to directly couple with a first shelf within the first enclosure to structurally support computerized equipment having a particular dimension that is a first size within the first enclosure; and
detachably coupling at least one additional frame with the main frame inside the first enclosure defined by the plurality of fixed structural elements the first enclosure to at least partially define a second enclosure within the first enclosure, the second enclosure having a particular second set of dimensions that is different from the particular first set of dimensions, the particular second set of dimensions including a second width and a second length, the second width different from the first width, the second length different from the first length, such that the plurality of fixed structural elements continue to define the first enclosure having the particular first set of dimensions simultaneously with the at least one additional frame defining the second enclosure having the particular second set of dimensions within the first enclosure, the at least one additional frame configured to couple with a second shelf within the second enclosure to structurally support computerized equipment having the particular dimension that is a second size within the second enclosure, the second size different from the first size,
wherein the at least one additional frame has a rectangular parallelepiped shape defining an empty interior at least partially bounded by structural material, in a structure of which one side is open,
wherein the at least one additional frame is configured to couple with the second shelf within the second enclosure such that the main frame that defines the first enclosure is indirectly coupled with the second shelf within the second enclosure via the at least one additional frame,
wherein the rack further includes a rear frame configured to at least partially define a rear enclosure configured to support a direct current (DC) rectifier module.

12. The method of claim 11, wherein the first size is greater than the second size.

13. The method of claim 11, wherein the first size is 21 inches and the second size is 19 inches.

14. The method of claim 11, wherein
the at least one additional frame includes four additional frames, and
the detachably coupling the at least one additional frame includes detachably coupling the four additional frames with separate, respective corner portions of the main frame, the separate, respective corner portions of the main frame defining separate, respective corner portions of the first enclosure.

15. The method of claim 11, wherein the detachably coupling the at least one additional frame includes fastening the at least one additional frame to the main frame using a bolt and a nut.

16. The method of claim 11, wherein
the plurality of fixed structural elements of the main frame includes at least one structural element that includes a hole, and
the detachably coupling the at least one additional frame fixably extends at least one hook of the at least one additional frame through the hole of the main frame.

17. The method of claim 11, wherein the main frame includes a coupler configured to couple with the at least one additional frame based on the at least one additional frame having a first particular shape.

18. The method of claim 11, wherein
at least a portion of the rear frame includes a mesh configured to support cable management.

19. The method of claim 11, wherein the at least one additional frame is an individual frame.

20. The method of claim 11, wherein
the main frame includes a plurality of coupling points, and
the detachably coupling the at least one additional frame couples the at least one additional frame with at least one coupling point of the plurality of coupling points to be detachably coupled with the main frame.

* * * * *